(12) United States Patent
Gligoric

(10) Patent No.: US 6,751,316 B1
(45) Date of Patent: *Jun. 15, 2004

(54) CLICK-FREE MUTING CIRCUIT FOR HEADSET

(75) Inventor: Nikola Gligoric, Ottawa (CA)

(73) Assignee: Mitel Corporation (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/459,321

(22) Filed: Dec. 10, 1999

Related U.S. Application Data

(63) Continuation-in-part of application No. 09/418,704, filed on Oct. 15, 1999, now Pat. No. 6,292,560.

(30) Foreign Application Priority Data

Dec. 11, 1998 (GB) .............................................. 9827184

(51) Int. Cl.⁷ ............................. H04M 1/00; H04M 9/00
(52) U.S. Cl. .................. 379/421; 379/428.02; 379/424; 381/94.5
(58) Field of Search ........................ 381/94.5; 379/421

(56) References Cited

U.S. PATENT DOCUMENTS

| | | | | |
|---|---|---|---|---|
| 3,916,321 A | * | 10/1975 | Morse | 455/222 |
| 4,441,086 A | * | 4/1984 | Karlow et al. | 330/297 |
| 4,448,074 A | | 5/1984 | Schmidt | |
| 4,451,706 A | * | 5/1984 | Boeckmann | 379/393 |
| 5,151,942 A | * | 9/1992 | Sasaki | 381/94.5 |
| 5,353,347 A | * | 10/1994 | Irissou et al. | 379/395 |
| 6,292,560 B1 | * | 9/2001 | Gligoric | 379/421 |

FOREIGN PATENT DOCUMENTS

| | | |
|---|---|---|
| EP | 0 202 016 | 11/1986 |
| GB | 592917 | 10/1947 |
| GB | 2317783 | 4/1998 |

* cited by examiner

*Primary Examiner*—Minsun Harvey
*Assistant Examiner*—Andrew Graham
(74) *Attorney, Agent, or Firm*—Jones Dayu

(57) ABSTRACT

A click-muting circuit for a headset microphone connected to a telephone, comprising a user operated mute switch, a click eliminator circuit connected across the microphone for gradually creating a short circuit across the microphone in response to closure of the mute switch, and a hard muting circuit connected in series with the microphone for disconnecting the microphone after the short circuit has been established.

7 Claims, 9 Drawing Sheets

CLICK-FREE MUTING CIRCUIT FOR HEADSET

This application is a continuation-in-part of U.S. patent application Ser. No. 09/418,704 filed Oct. 15, 1999, U.S. Pat. No. 6,292,560.

FIELD OF THE INVENTION

The present invention relates in general to telephone headsets, and more particularly to a circuit for providing click-free muting of a telephone headset.

BACKGROUND OF THE INVENTION

Headsets are useful for hands free telephony in circumstances in which a person requires the use of his or her hands for operation of a computer, switchboard, etc. Headsets are usually connected to the handset port of a telephone set through an interface box. The interface box allows the user to select whether the headset or the handset is activated. Prior art interface boxes vary greatly in complexity, but most boxes include a headset volume control. Some such boxes are battery operated while others steal current from the microphone bias circuit.

One common problem associated with the use of telephone headsets is the generation of unpleasant clicking noises which occur when a mute button for the headset microphone is depressed or released. Another problem is insufficient "hard" muting.

According to one prior art approach, an AC coupled mute switch has been used to provide headset microphone muting. Unfortunately, this approach generally fails to sufficiently attenuate the microphone signal (i.e. no "hard" muting) and is not capable of performing headset switch detection which is a desirable feature of telephone headsets which can function also using a regular handset. DC coupled mute switches overcome the problem of headset switch detection but produce the aforenoted unpleasant click noise. Another approach involves the use of expensive battery powered microphone amplifier muting circuits. These circuits are normally implemented within cumbersome interface boxes attached to the telephone, and often o not provide a hard muting function.

SUMMARY OF THE INVENTION

According to the present invention, a circuit is provided which is capable of headset detection and microphone mute switch closure detection and which overcomes the above-discussed disadvantages of the prior art. The circuit provides click-free switching, 80 dB muting and is of inexpensive construction. No extra power supply is required, and the circuit is capable of providing headset detection.

BRIEF INTRODUCTION TO THE DRAWINGS

A detailed description of the preferred embodiment is provided herein below, with reference to the following drawings, in which.

DETAILED DESCRIPTION OF THE PREFERRED EMBODIMENT

Figure 1:
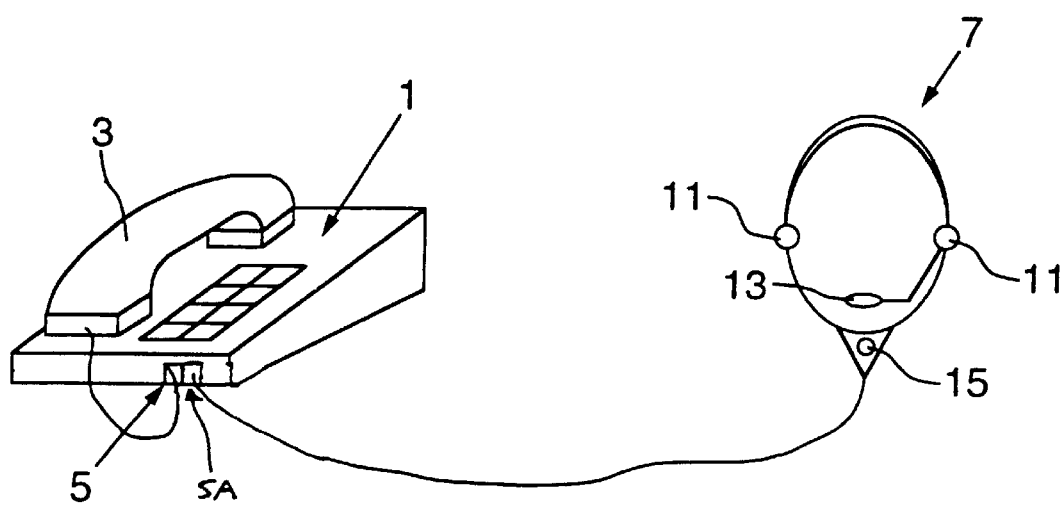
FIG. 1 shows a telephone headset with mute switch connected to a telephone set, in accordance with the present invention.

In FIG. 1, a standard telephone set 1 is shown with a handset 3 thereof resting in a handset cradle. The handset 3 is normally connected to the telephone set via a handset port 5 (e.g. RJ-11). In the illustrated embodiment, a headset 7 is connected to the telephone set 1 via headset port 5 A. The headset may also be connected to the handset port 5 and in that case, the bias circuit 21 (see below) must be designed in such a way that the bias circuit functions with both microphones; the handset microphone and the headset microphone. Headset 7 includes a pair of earpieces 11 and a microphone 13 (e.g. low voltage condenser microphone), in a usual manner.

Figure 2A:
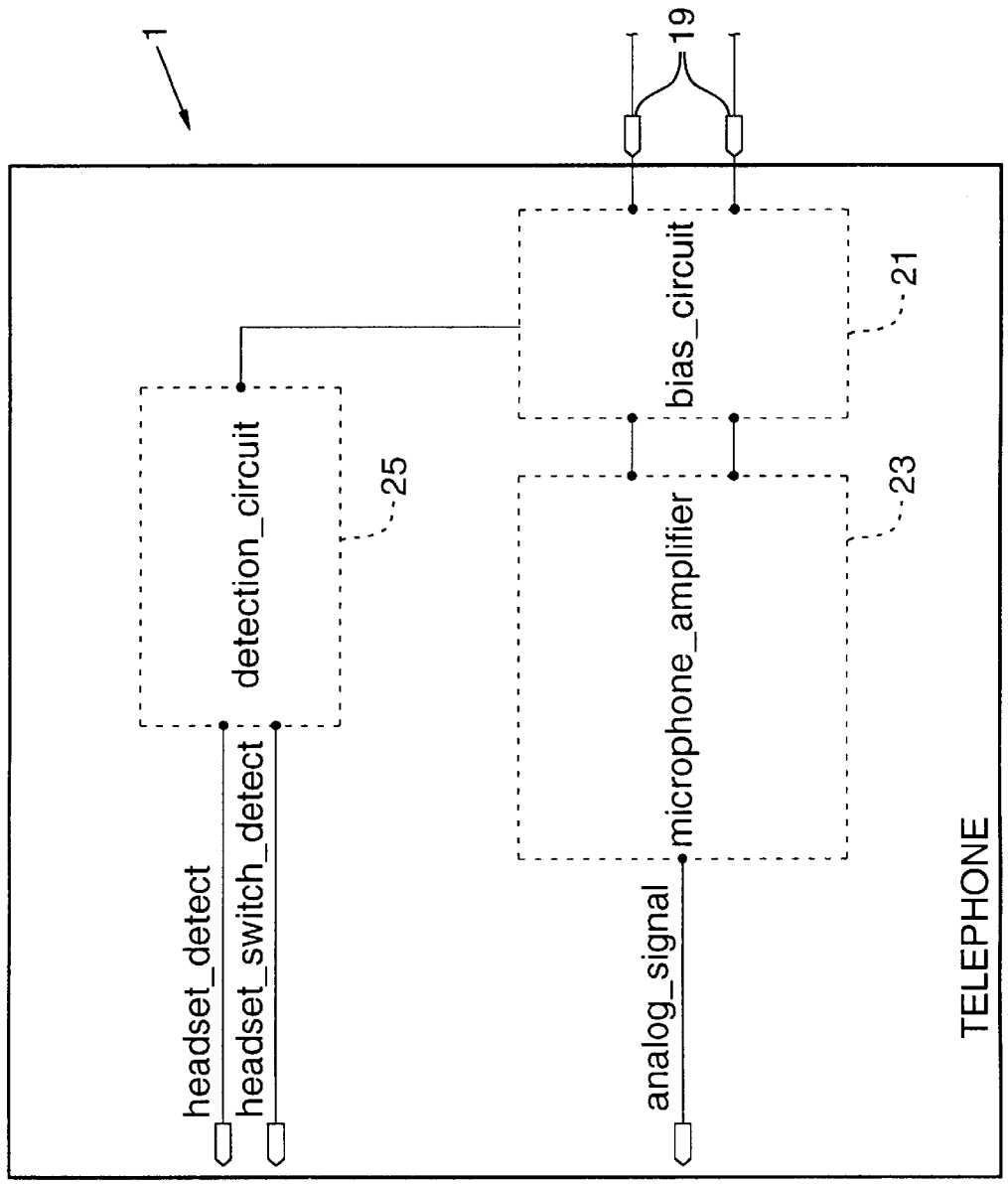
FIG. 2 is a block diagram showing connection of the headset with mute circuit to the telephone set of FIG. 1.
Figure 2B:
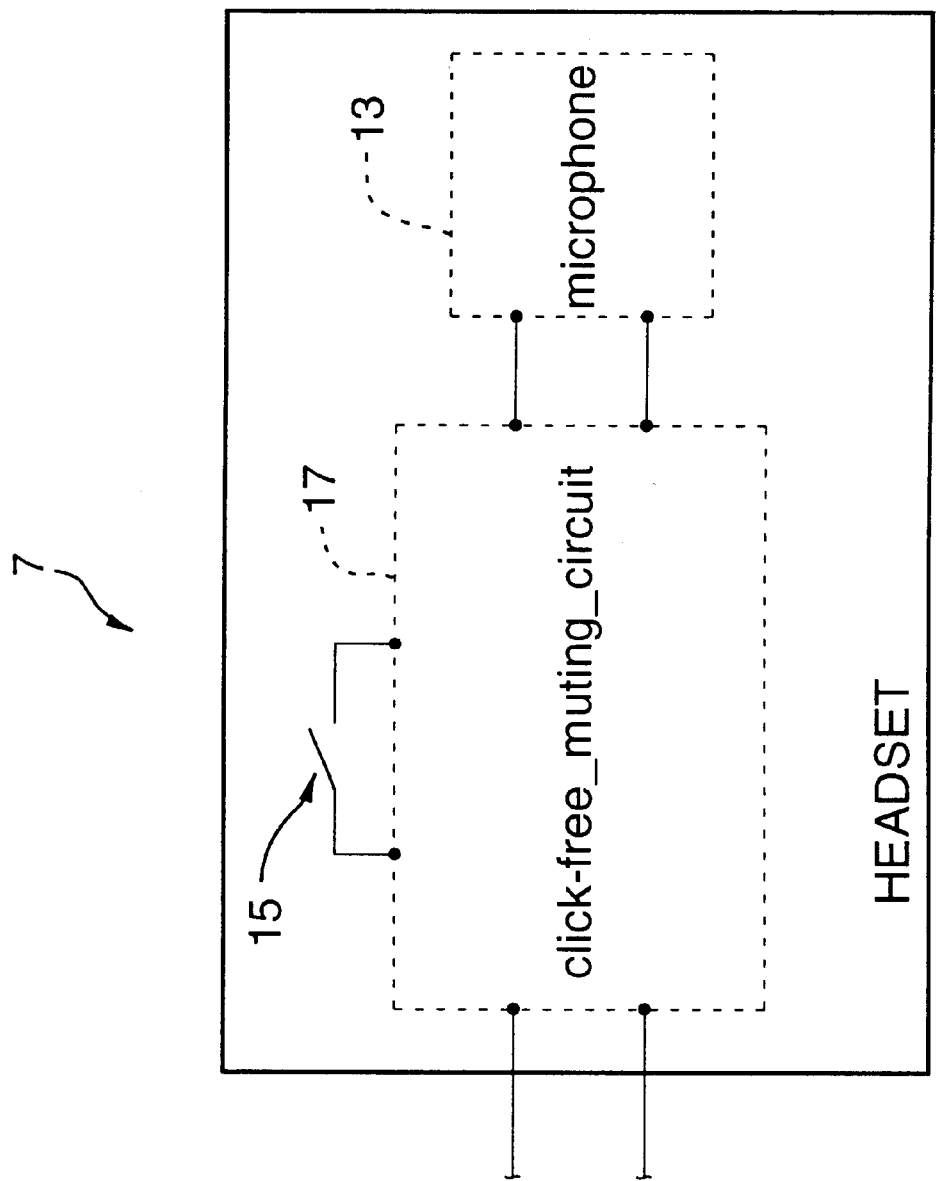

With reference to FIG. 2 in combination with FIG. 1, according to the present invention, a switch 15 is connected to a click-free muting circuit 17 which, in turn, is connected across the terminals of microphone 13. Thus, the circuit 17 is connected between the microphone 13 and the microphone audio line connector 19 of the telephone set 1.

Headset microphone bias circuit 21 provides bias current for the microphone 13, in a well known manner. A microphone amplifier 23 is connected differentially to the bias circuit 21 for amplifying the low voltage output signals therefrom. An output of microphone amplifier 23 (analog__ signal) is connectable to a phone chip (not shown) within the telephone set 1, in a well known manner. Although not shown, the earpieces 11 of the headset 7 and the earpiece of the handset 3 are normally connected together and to an output of the phone chip.

A headset detector circuit 25 is connected to the output of microphone bias circuit 21 for providing a signal (headset__ detect) to the phone chip for indicating that headset 7 is connected to the set 1. Since many headsets are connected to telephones via a "quick-disconnect" plug, when the handset 3 is left in its cradle and the headset 7 is disconnected, it is still possible to use the telephone via the handset operation. The detector circuit 25 also generates a signal (headset__switch__detect) indicative of a momentary depression of the mute switch 15 for interpretation by the phone chip as a hookswitch event for invoking a telephone special feature (e.g. soft hold, call forward, etc.). The structure and operation of the circuit 25 is discussed in greater detail in co-assigned U.S. Pat. No. 5,832,075 entitled "Off-Hook Detector for Headset", the contents of which are incorporated herein by reference.

Figure 3:
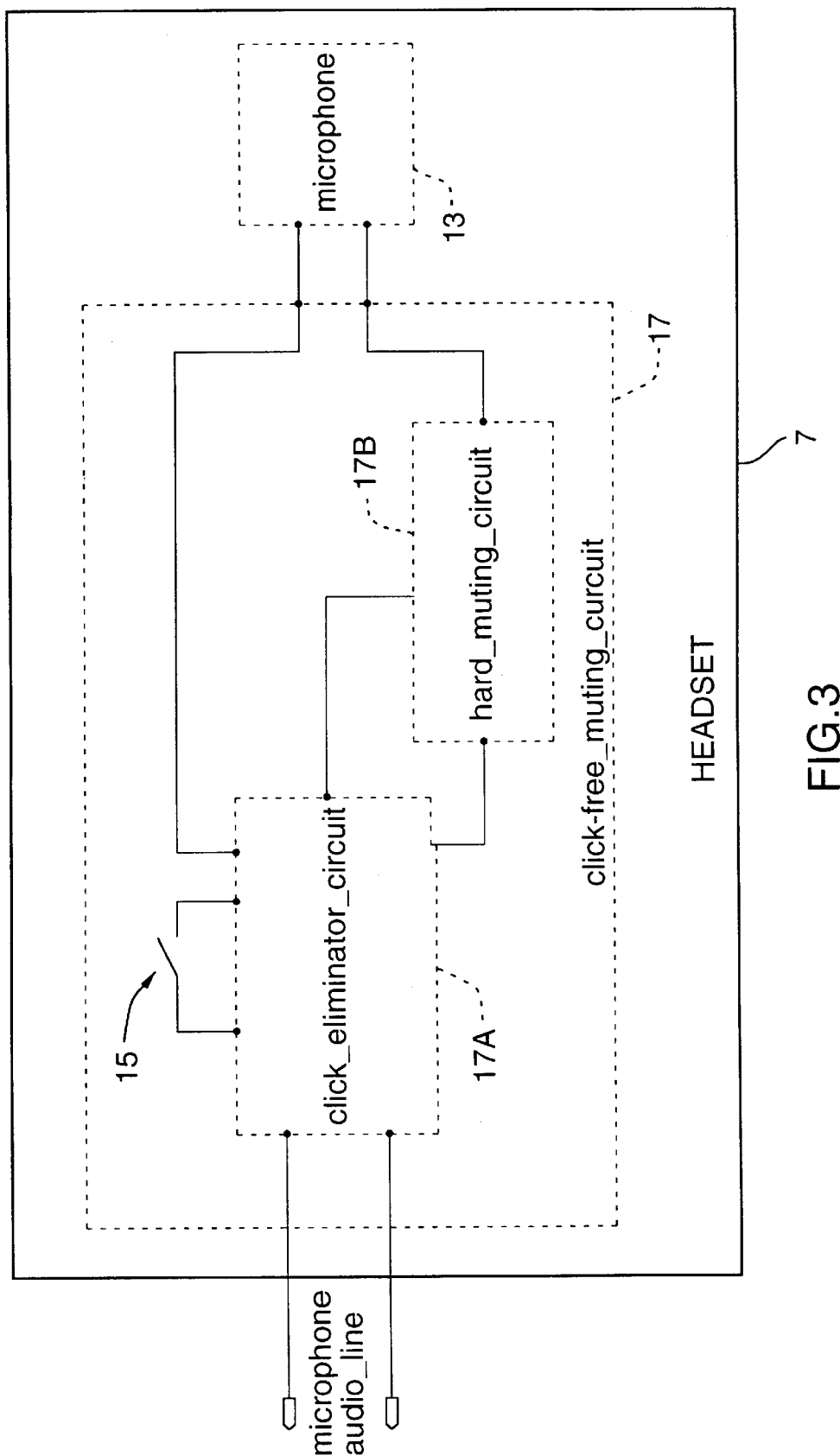
FIG. 3 is a block diagram of the click-free muting circuit according to the preferred embodiment.

With reference to FIG. 3, the muting circuit 17 is shown comprising a click eliminator circuit 17A and a hard muting circuit 17B. An implementation of the circuit 17 is shown according to the preferred embodiment with reference to the schematic diagram of FIG. 4.

In operation, circuit 17 steals current from the bias circuit 21, so that no extra power supply is required. When the switch 15 is closed, the click eliminator circuit 17A slowly creates a short circuit across the microphone 13, thereby suppressing any impulse click noise from being created. Once the click eliminator circuit 17A has fully short circuited the microphone 13, hard muting circuit 17B completely disconnects the microphone 13, thereby resulting in a hard mute (80 dB). When the switch 15 is released, hard muting circuit 17B re-connects the microphone 13 and click eliminator circuit 17A slowly removes the short circuit across the microphone 13, thereby again suppressing impulse switch noise during resumption of microphone operation after muting.

Figure 4A:
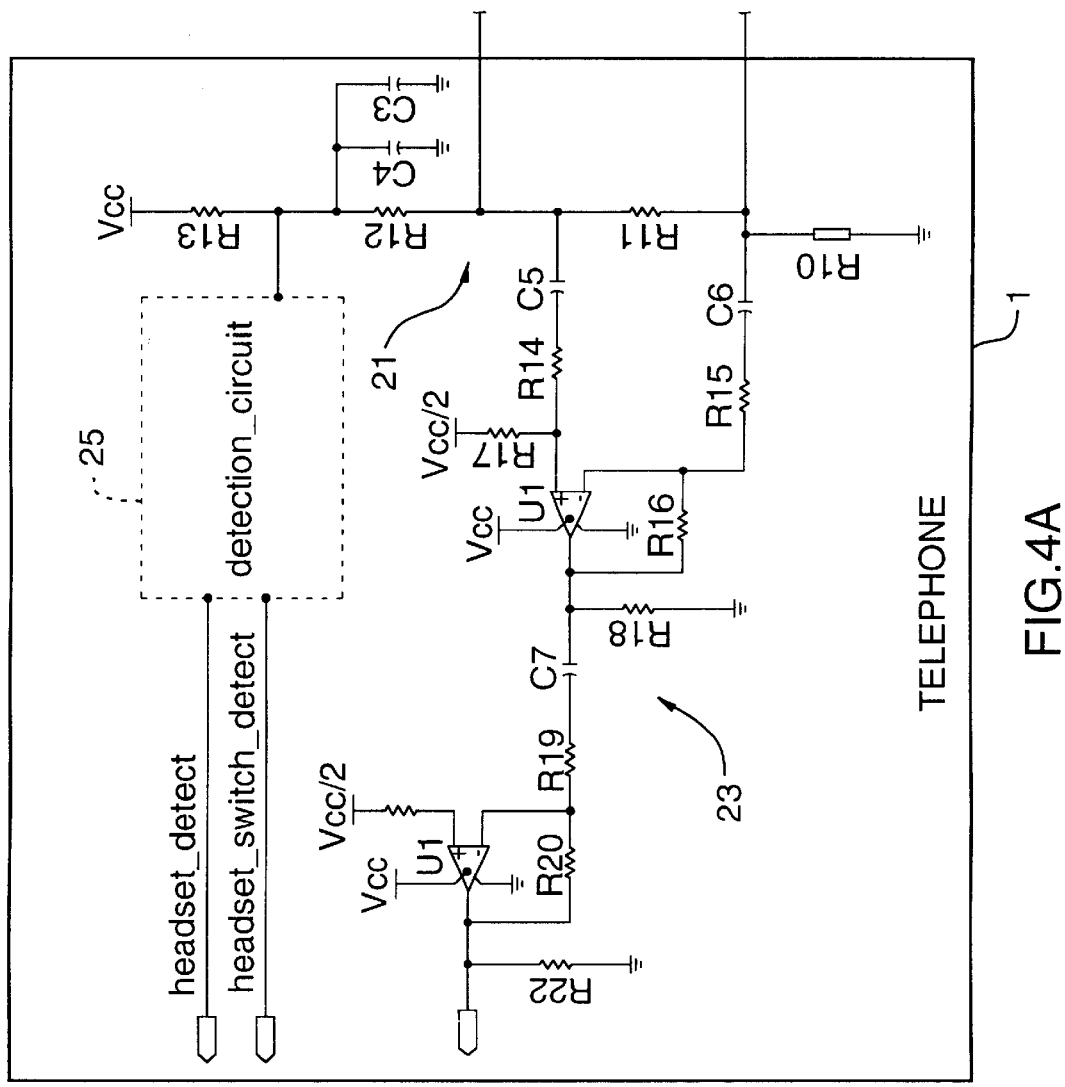
FIG. 4 is a circuit diagram of the click-free muting circuit according to a first embodiment connected to the telephone set.
Figure 4B:
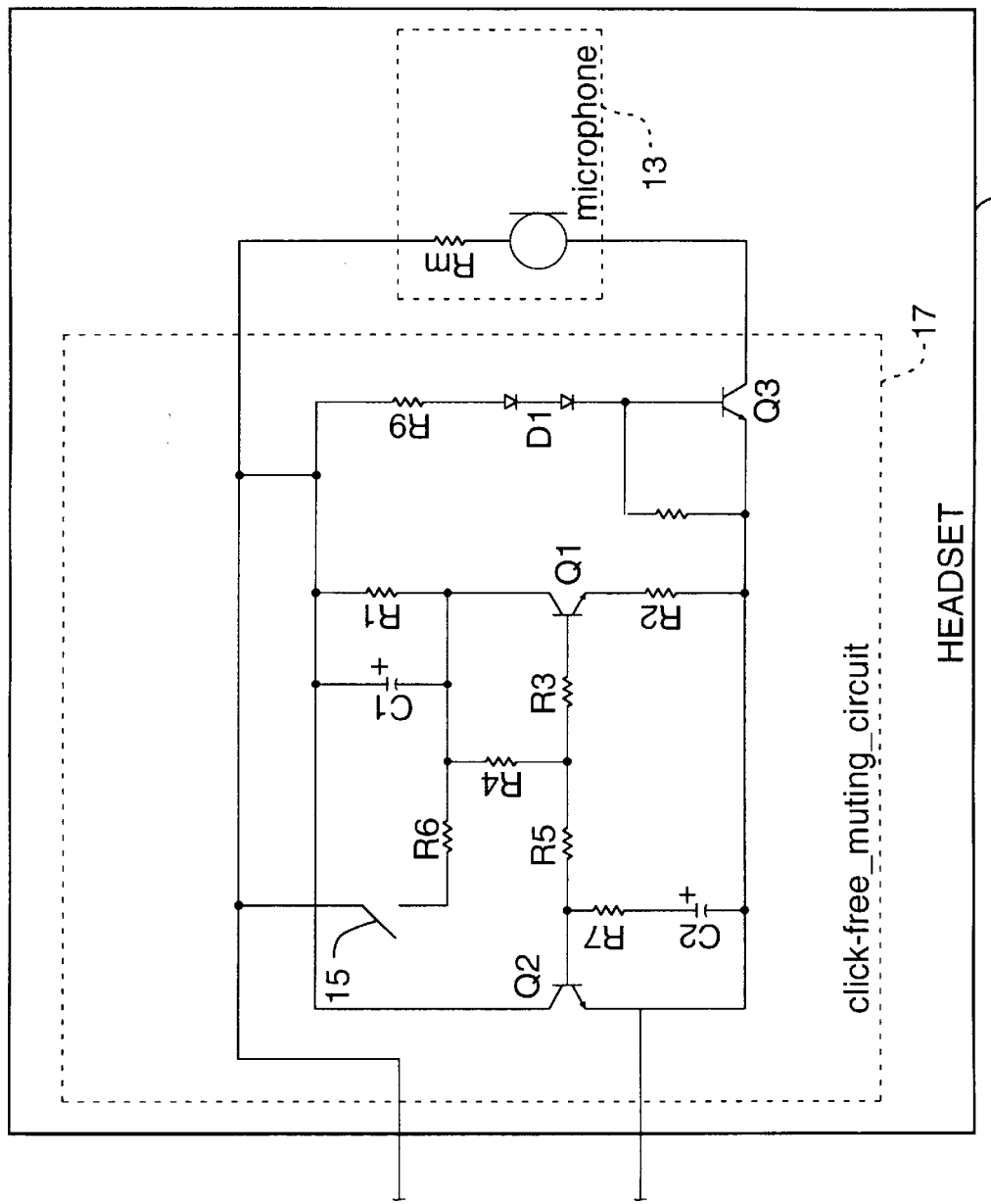

More particularly, having regard to the embodiment illustrated in FIG. 4, transistor Q3 is normally on (i.e. saturated by the bias voltage applied across its base-emitter junction) as a result of the base-emitter voltage applied thereto via diodes D1, so that the microphone 13 is normally connected to the line. The use of dual diode D1 ensures two distinct states for operation of transistor Q3 (on and off), regardless of variations in parameters of the microphone and transistor Q3. The transistors Q1 and Q2 are normally off (i.e. the click eliminator circuit 17A does not normally short circuit the microphone 13), capacitor C1 is normally charged to the voltage across R1 and capacitor C2 is normally charged to a low voltage which is insufficient to turn on transistor Q2. Upon closing switch 15, capacitor C2 begins to charge slowly through resistors R6, R4, R5 and R7 and capacitor C1 begins to discharge slowly thereby gradually turning on transistor Q2 so as to create a short circuit across the terminals of microphone 13. Shortly after the switch 15 is depressed, the voltage at the input of the detection circuit 21 begins to fall and the headset_switch_detect signal changes state so as to indicate mute switch detection. The duration of the headset_switch_detect signal is slightly longer than actual depression of the mute switch 15. The speed of the click elimination circuit 17A is governed by the choice of capacitors C1, C2 and resistors R1, R6, R5 and R7, and further regulated by the turning on of transistor Q1. More particularly, the equivalent resistance of transistor Q2 together with the remaining resistors forms a voltage divider with resistor R1. The current through transistor Q1 is small (in both on and off states) because resistor R1 is of high resistance (e.g. 510K ohm). Once the short circuit is fully established (i.e. the click eliminator circuit 17A is fully on), Q3 is no longer forward biased (as a result of the short circuit through transistor Q2) and turns off, thereby completely disconnecting the microphone 13 from the line and yielding a hard mute (80 dB).

Figure 5A:
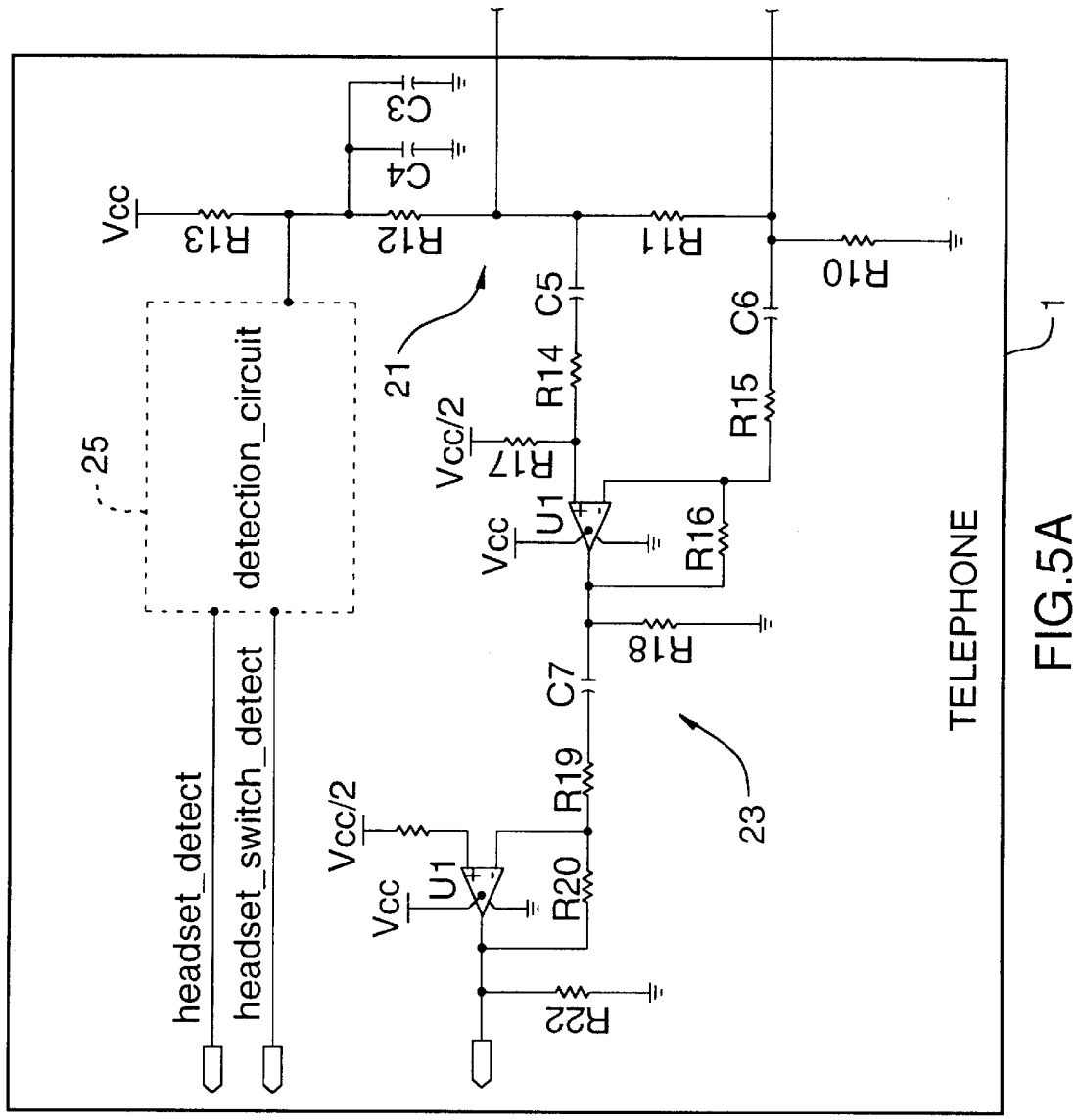
FIG. 5 is a circuit diagram of the click-free muting circuit according to a preferred embodiment of the invention.
Figure 5B:
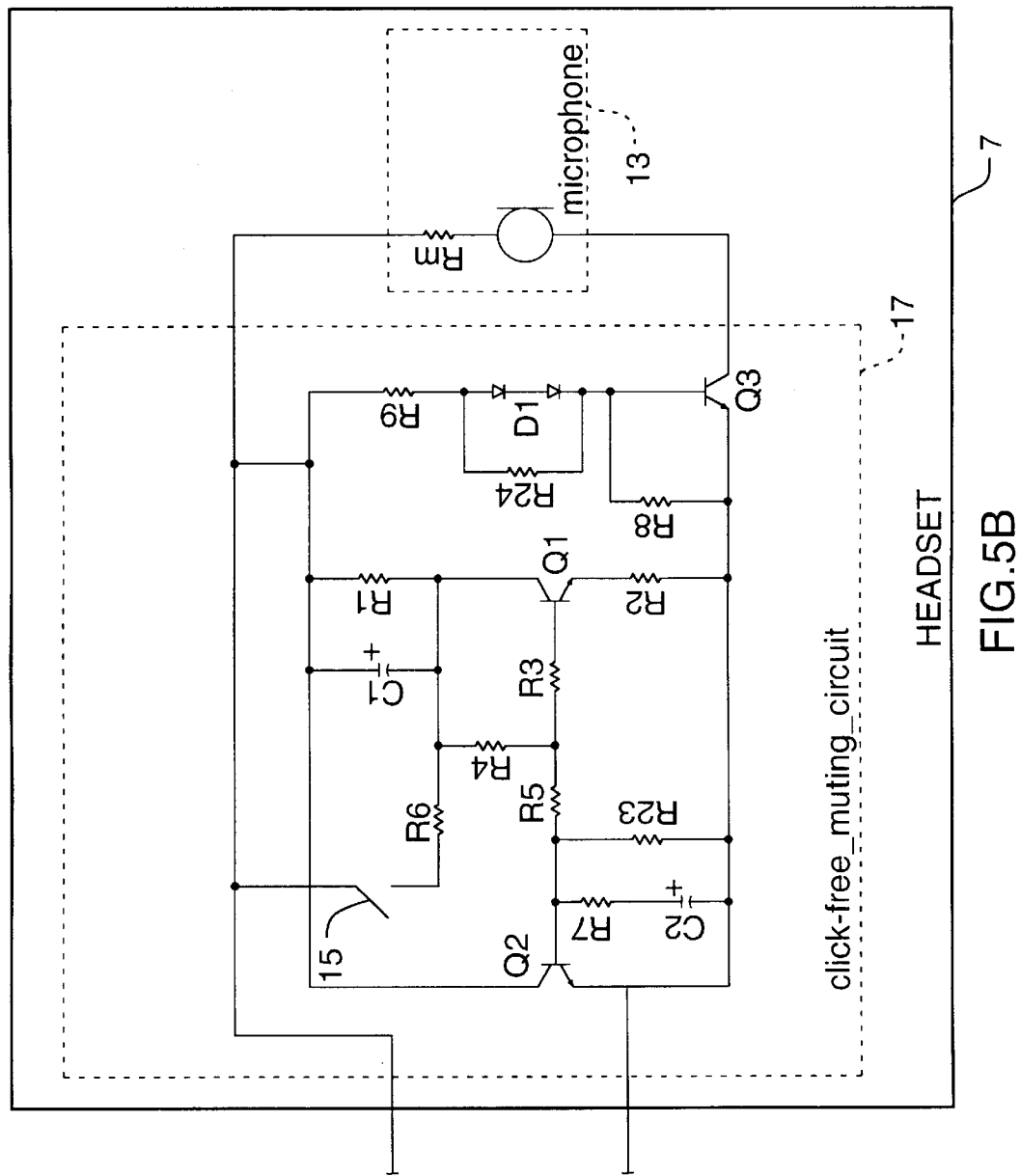

Turning to FIG. 5, a preferred embodiment of the click-free muting circuit is shown. The circuit of FIG. 5 is identical to the circuit of FIG. 4 but includes a pair of additional resistors R23 and R24. Resistor R23 is connected between the base and emitter of transistor Q2, while resistor 24 is connected across the dual diode D1.

Figure 6:
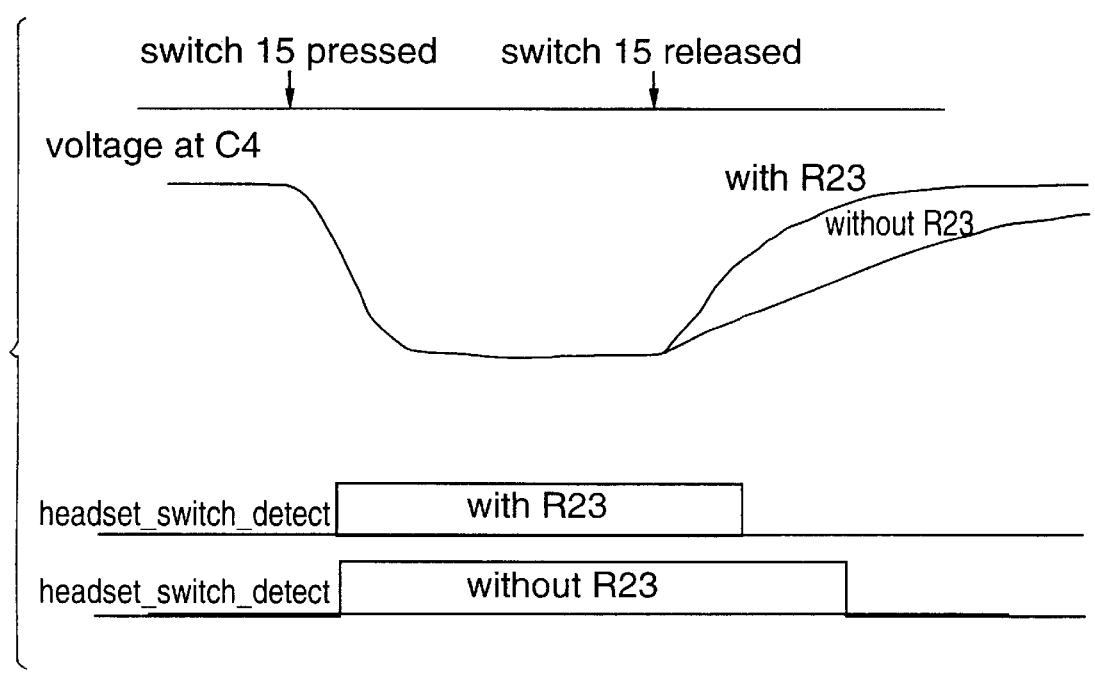
FIG. 6 is a timing diagram showing differences in operation as between the embodiments of FIGS. 4 and 5.

The addition of resistor 23 regulates the timing and duration of the headset_switch_detect signal generated by detection circuit 25 such that the duration of the signal becomes approximately the same as the duration of depression of the mute switch 15 but is delayed therefrom by a short amount (approximately 100 ms in the preferred embodiment). The differences in timing of the headset_switch_detect signal with and without R23 is set forth in FIG. 6. As a consequence of the addition of resistor R23, transistor Q1 and resistors R2 and R3 can be eliminated (not shown as eliminated in FIG. 5), resulting in a lower cost circuit. In this latter configuration operation is similar to the circuit of FIG. 4 in that the duration of the headset_switch_detect signal becomes slightly longer than the actual duration of mute switch depression. Furthermore, the detection voltage range at the input of detection circuit 25 is somewhat smaller.

Resistor R24 is a zero Ohm resistance which can be used to replace the dual diode D1 (again, the elimination of diodes D1 is not shown in FIG. 5), to reduce the cost of the circuit while providing essentially the same functionality.

Since resistor R24 exhibits zero resistance (theoretically), it can be eliminated so that either only one diode D1 or no diode can be provided (not shown). If one or both diodes D1 are eliminated in favour of resistor R24 (or no resistor whatsoever) then care must be taken to choose a transistor Q3 having few variations in its stated operating parameters.

Although the switch 15 is shown located at the headset 7, it is also contemplated that the switch could be located at a headset interface box (not shown) between the headset 7 and telephone set 1. In either case, provision of the local switch 15 relieves the user from having to, reach over to the set in order to mute the microphone 13. It is also contemplated that the switch 15 can be installed as a retrofit to existing headsets in the form of a series device which can dangle from the cable connecting the headset 7 to the telephone set 1 or interface box.

Other embodiments and variations are possible without departing from the sphere and scope of the invention as defined by the claims appended hereto.

I claim:

1. A click-free muting circuit for a headset microphone connected to a telephone, comprising:
a user operated mute switch;
a click eliminator circuit connected across said microphone for gradually creating a short circuit across said microphone in response to closure of said mute switch, said click eliminator circuit comprising at least one first transistor having a current conducting path connected across said microphone and a control terminal connected via a capacitance to said mute switch such that in response to said closure of the mute switch bias voltage on said control terminal gradually increases thereby turning on said transistor and causing current to flow through said current conducting path, and a resistance connected in parallel to said capacitance; and
a hard muting circuit connected in series with said microphone for disconnecting said microphone in response to said short circuit.

2. The click-free muting circuit of claim 1, wherein said hard muting circuit comprises at least one further transistor having a current conduction path in series with said microphone and a control terminal connected to the current conducting path of said at least one first transistor such that current is drawn from said control terminal of said further transistor thereby turning off said further transistor and disconnecting said microphone via the current conduction path of said further transistor.

3. The click-free muting circuit of claim 1 wherein said at least one first transistor is a bipolar junction transistor.

4. A click-free muting circuit for a headset microphone connected to a telephone, comprising:
a user operated mute switch;
a click eliminator circuit connected across said microphone for gradually creating a short circuit across said microphone in response to closure of said mute switch; and
a hard muting circuit connected in series with said microphone for disconnecting said microphone in response to said short circuit, said hard muting circuit comprising at least one further transistor-having a current conduction path in series with said microphone and a control terminal connected to the current conducting path of said at least one first transistor such that current is drawn from said control terminal of said further transistor thereby turning off said further transistor and disconnecting said microphone via the current conduction path of said further transistor, and at least one diode connected to a base terminal of said further transistor.

5. The click-free muting circuit of claim 4, wherein said click eliminator circuit further comprises at least one first transistor having a current conducting path connected across said microphone and a control terminal connected via a capacitance to said mute switch such that in response to said closure of the mute switch bias voltage on said control terminal gradually increases thereby turning on said transistor and causing current to flow through said current conducting path.

6. The click-free muting circuit of claim 5, further comprising a resistance connected in parallel to said capacitance.

7. The click-free muting circuit of claim 4 wherein said further transistor is a bipolar junction transistor.

* * * * *